(12) United States Patent
Dan et al.

(10) Patent No.: US 10,996,251 B2
(45) Date of Patent: May 4, 2021

(54) METHOD AND DEVICE FOR OBTAINING INTERNAL SIDE, EXTERNAL SIDE INSULATION RESISTANCES OF RELAY, AND BATTERY MANAGEMENT SYSTEM

(71) Applicant: Contemporary Amperex Technology Co., Limited, Ningde (CN)

(72) Inventors: Zhimin Dan, Ningde (CN); Yizhen Hou, Ningde (CN); Weiping Sun, Ningde (CN); Meng Li, Ningde (CN); Wei Zhang, Ningde (CN); Teng Yu, Ningde (CN)

(73) Assignee: Contemporary Amperex Technology Co., Limited

( * ) Notice: Subject to any disclaimer, the term of this patent is extended or adjusted under 35 U.S.C. 154(b) by 181 days.

(21) Appl. No.: 16/233,620

(22) Filed: Dec. 27, 2018

(65) Prior Publication Data
US 2019/0234997 A1    Aug. 1, 2019

(30) Foreign Application Priority Data
Feb. 1, 2018    (CN) .......................... 201810103562.7

(51) Int. Cl.
*G01R 27/20*    (2006.01)
*H01H 47/00*    (2006.01)
(Continued)

(52) U.S. Cl.
CPC .......... *G01R 27/205* (2013.01); *B60L 3/0069* (2013.01); *B60L 3/12* (2013.01);
(Continued)

(58) Field of Classification Search
CPC .... G01R 31/364; G01R 1/203; G01R 27/205; G01R 31/3278; G01R 31/006;
(Continued)

(56) References Cited

U.S. PATENT DOCUMENTS

| 2016/0107525 | A1 | 4/2016 | Min et al. | |
| 2017/0141444 | A1* | 5/2017 | Kawahara | ......... H01M 10/4285 |
| 2018/0038904 | A1* | 2/2018 | Horiguchi | ......... G01R 31/1272 |

FOREIGN PATENT DOCUMENTS

| CN | 102539917 | 7/2012 |
| CN | 103605056 | 2/2014 |

(Continued)

*Primary Examiner* — Melissa J Koval
*Assistant Examiner* — Trung Nguyen
(74) *Attorney, Agent, or Firm* — Forge IP, PLLC

(57) ABSTRACT

Provided is a method and device for obtaining internal side and external side insulation resistances of a relay. The method includes steps of controlling the insulation resistance obtaining circuit to output a low-frequency AC signal; when both the main relay and the pre-charge relay are switched off, obtaining an internal side insulation resistance of the main relay according to the low-frequency AC signal; if the internal side insulation resistance of the main relay is normal, controlling the pre-charge relay to be switched on; and when the main relay is switched off and the pre-charge relay is switched on, obtaining an external side insulation resistance value of the main relay according to the low-frequency AC signal.

14 Claims, 7 Drawing Sheets

(51) Int. Cl.
  *H01M 10/42*   (2006.01)
  *B60L 50/60*   (2019.01)
  *B60L 3/00*    (2019.01)
  *B60L 3/12*    (2006.01)
  *G01R 31/327*  (2006.01)
  *G01R 31/00*   (2006.01)

(52) U.S. Cl.
  CPC .......... *B60L 50/60* (2019.02); *G01R 31/3278* (2013.01); *H01H 47/002* (2013.01); *H01M 10/425* (2013.01); *G01R 31/006* (2013.01); *H01M 2010/4271* (2013.01)

(58) Field of Classification Search
  CPC ...... H01M 10/48; H01M 2/30; H01M 10/425; H01M 2010/4271; B60L 3/12; B60L 3/0069; B60L 50/60; H01H 47/002
  USPC ............. 324/415, 437, 425–433, 76.11, 126, 324/756.05, 538, 200, 207.13, 233, 256, 324/515, 500–530, 750.06
  See application file for complete search history.

(56) References Cited

FOREIGN PATENT DOCUMENTS

| | | |
|---|---|---|
| CN | 103921684   | 7/2014 |
| CN | 104076254   | 10/2014 |
| CN | 104750000   | 7/2015 |
| CN | 106053947   | 10/2016 |
| CN | 106080209   | 11/2016 |
| CN | 106646170   | 5/2017 |
| CN | 107064638   | 8/2017 |
| CN | 107479002 A | 12/2017 |
| CN | 107607785   | 1/2018 |
| KR | 1020140068567 A | 8/2014 |

* cited by examiner

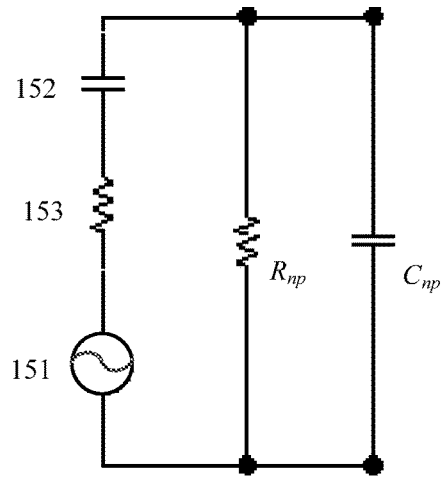

FIG. 4 when both the main relay and the pre-charge relay are switched off, collecting electrical signals at the two sampling points by the insulation resistance obtaining circuit — S2031 obtaining a first phase shift of the low-frequency AC signal between the two sampling points according to the collected electrical signals — S2032 obtaining the internal side insulation resistance of the main relay according to the collected electrical signals and the first phase shift — S2033

FIG. 5

METHOD AND DEVICE FOR OBTAINING INTERNAL SIDE, EXTERNAL SIDE INSULATION RESISTANCES OF RELAY, AND BATTERY MANAGEMENT SYSTEM

CROSS-REFERENCE TO RELATED APPLICATIONS

The present application claims priority to Chinese Patent Application No. 201810103562.7, filed on Feb. 1, 2018, the content of which is incorporated herein by reference in its entirety

TECHNICAL FIELD

The present application relates to the field of insulation technology and, particularly, relates to a method, a device for obtaining internal side and external side insulation resistances of a relay, and a battery management system.

BACKGROUND

It is a trend in the development of automobile industry that the electric vehicles replace the oil-fueled vehicles. The endurance mileage, service life, safety and the like of power batteries are particularly important to the use of electric vehicles. Insulation performance, as one of the indexes for evaluating the safety performance, is an indispensable test item in the power batteries.

A main relay includes a main positive relay and a main negative relay, wherein the main positive relay is a relay connected in a main circuit of a positive electrode of a battery pack, and the main negative relay is a relay connected in a main circuit of a negative electrode of the battery pack. A load may be connected between the main positive relay and the main negative relay. The existing methods for obtaining the insulation resistance values of the main relay generally can only obtain an internal side insulation resistance of the main relay. However, an external side insulation resistance of the main relay can be obtained only when the main relay is switched on. The internal side insulation resistance is an insulation resistance of the relay at a side of the relay close to the battery pack, while the external side insulation resistance of the relay is an insulation resistance of the relay at a side of the relay away from the battery pack.

In view of the above, when an insulation fault occurs to the side of the main relay away from the battery pack, the insulation situation of the main relay at the side of the main relay away from the battery pack cannot be obtained if the main relay is switched off, which may cause dangerous contact between the high voltage and the ground. In contrast, if the main relay is directly switched on, the insulation failure at the side of the relay away from the battery pack may also lead to security incidents.

SUMMARY

In view of the above, embodiments of the present disclosure provide a method and a device for obtaining an internal side insulation resistance and an external side insulation resistance of a relay, especially for obtaining an internal side insulation resistance and an external side insulation resistance of the main relay, so as to solve the problems in the prior art that the external side insulation conditions of the main relay cannot be obtained when the main relay is switched off as well as the problem of the accompanying security risk.

In a first aspect, an embodiment of the present disclosure provides a method for obtaining internal side and external side insulation resistances of a relay. The method is applied to a circuit comprising a battery pack, a main relay and a pre-charge circuit. The main relay comprises a main positive relay and a main negative relay, the pre-charge circuit comprises a pre-charge relay and a pre-charge resistor and is connected in parallel to both sides of the main positive relay, an insulation resistance obtaining circuit is connected between the battery pack and the main positive relay, wherein the method comprises steps of: controlling the insulation resistance obtaining circuit to output a low-frequency AC signal; when both the main relay and the pre-charge relay are switched off, obtaining an internal side insulation resistance of the main relay according to the low-frequency AC signal; if the internal side insulation resistance of the main relay is normal, controlling the pre-charge relay to be switched on; and when the main relay is switched off and the pre-charge relay is switched on, obtaining an external side insulation resistance of the main relay according to the low-frequency AC signal.

According to a further embodiment, before the step of controlling the pre-charge relay to be switched on, the method further comprises steps of: detecting whether the internal side insulation resistance of the main relay is normal or not; if it is detected that the internal side insulation resistance of the main relay is normal, performing the step of controlling the pre-charge relay to be switched on and the subsequent steps; and if it is detected that the internal side insulation resistance of the main relay is abnormal, performing an alarm operation.

According to a further embodiment, the step of detecting whether the internal side insulation resistance of the main relay is normal or not comprises: detecting whether the internal side insulation resistance of the main relay is greater than a first preset alarm threshold; if the internal side insulation resistance of the main relay is greater than the first preset alarm threshold, determining that the internal side insulation resistance of the main relay is normal; and if the internal side insulation resistance of the main relay is smaller than or equal to the first preset alarm threshold, determining that the internal side insulation resistance of the main relay is abnormal.

According to a further embodiment, the method further comprises steps of: detecting whether the external side insulation resistance of the main relay is normal or not; if it is detected that the external side insulation resistance of the main relay is normal, ending the detecting; and if it is detected that the external side insulation resistance of the main relay is abnormal, performing an alarm operation.

According to a further embodiment, the step of detecting whether the external side insulation resistance of the main relay is normal or not comprises: detecting whether the external side insulation resistance of the main relay is greater than a second preset alarm threshold; if the external side insulation resistance of the main relay is greater than the second preset alarm threshold, determining that the external side insulation resistance of the main relay is normal; and if the external side insulation resistance of the main relay is smaller than or equal to the second preset alarm threshold, determining that the external side insulation resistance of the main relay is abnormal.

According to a further embodiment, the step of ending the detecting comprises steps of: controlling the main negative relay to be switched on, so as to pre-charge a load; when the pre-charging of the load ends, controlling the pre-charge relay to be switched off; and controlling the main positive relay to be switched on.

According to a further embodiment, the insulation resistance obtaining circuit comprises two sampling points.

According to a further embodiment, the step of obtaining the internal side insulation resistance of the main relay according to the low-frequency AC signal comprises: when both the main relay and the pre-charge relay are switched off, collecting electrical signals at the two sampling points by the insulation resistance obtaining circuit; obtaining a first phase shift of the low-frequency AC signal between the two sampling points according to the collected electrical signals and obtaining a change in amplitude of the electrical signals collected at the two sampling points; and obtaining the internal side insulation resistance of the main relay according to the collected electrical signals and the first phase shift.

According to a further embodiment, the step of obtaining the external side insulation resistance of the main relay according to the low-frequency AC signal comprises: when the main relay is switched off and the pre-charge relay is switched on, collecting electrical signals at the two sampling points by the insulation resistance obtaining circuit; obtaining a second phase shift of the low-frequency AC signal between the two sampling points according to the collected electrical signals; and obtaining the external side insulation resistance of the main relay according to the collected electrical signals and the second phase shift.

According to a further embodiment, the insulation resistance obtaining circuit comprises: a signal synthesizer having a first terminal grounded; an isolation capacitor connected between a positive electrode of the battery pack and the main positive relay; a sampling resistor connected between a second terminal of the isolation capacitor and a second terminal of the signal synthesizer; a first sampling component connected to a first terminal of the sampling resistor; and a second sampling component connected to a second terminal of the sampling resistor.

According to a further embodiment, the first sampling component comprises: a first filter resistor having a first terminal connected to the first terminal of the sampling resistor; a first filter capacitor having a first terminal connected to a second terminal of the first filter resistor and a second terminal grounded; a first voltage follower having a first input terminal connected to both the first terminal of the first filter capacitor and the second terminal of the first filter resistor, and a second input terminal connected to an output terminal of the first voltage follower; and a first analog-to-digital converter connected to the output terminal of the first voltage follower.

According to a further embodiment, the second sampling component comprises: a second filter resistor, having a first terminal connected to the second terminal of the sampling resistor; a second filter capacitor having a first terminal connected to a second terminal of the second filter resistor, and a second terminal grounded; a second voltage follower having a first input terminal connected to both the first terminal of the second filter capacitor and the second terminal of the second filter resistor, and a second input terminal connected to an output terminal of the second voltage follower; and a second analog-to-digital converter connected to the output terminal of the second voltage follower.

In a second aspect, an embodiment of the present disclosure provides a device for obtaining internal side and external side insulation resistances of a relay. The device comprises an insulation resistance obtaining circuit for outputting an AC signal and collecting an electrical signal, and a processor, wherein the processor is configured to: control the insulation resistance obtaining circuit to output a low-frequency AC signal; obtain an internal side insulation resistance of a main relay according to the low-frequency AC signal when both the main relay and a pre-charge relay are switched off; control the pre-charge relay to be switched on when the internal side insulation resistance of the main relay is normal; and obtain an external side insulation resistance of the main relay according to the low-frequency AC signal when the main relay is switched off and the pre-charge relay is switched on.

In a third aspect, an embodiment of the present disclosure provides a battery management system comprising the device for obtaining internal side and external side insulation resistances of a relay according to the second aspect.

In a fourth aspect, an embodiment of the present disclosure provides a computer-readable storage medium, including: computer-executable instructions. The computer-executable instructions are executed to implement the method for obtaining the internals side and external side insulation resistances of the relay according to any one of the above-described embodiments the technical solutions described above have at least the following beneficial effects:

In the embodiment of the present disclosure, with respect to the circuit formed by the battery pack, the main relay and the pre-charge circuit, a low-frequency AC signal can be output by the insulation resistance obtaining circuit connected between the battery pack and the main positive relay, so as to obtain the internal side insulation resistance of the main relay when the main relay and the pre-charging relay are switched off; and when the internal side insulation resistance of the main relay is determined to be normal, the pre-charge relay is controlled to be switched on, and then the low-frequency AC signal is input into the pre-charge circuit, so as to obtain the external side insulation resistance of the pre-charge relay (i.e. equivalent to obtaining of the external side insulation resistance of the main relay) based on the low-frequency AC signal. In this process, the switched-off main relay excludes the security risk caused by the switch-on of the main relay when an insulation fault occurs to the side of the main relay away from the battery pack. Therefore, the technical solution provided by the embodiments of the present disclosure can obtain the internal side and external side insulation conditions of the main relay, so as to solve the problem in the prior art that the insulation condition at the side of the main relay away from the battery pack cannot be obtained when the main relay is switched off while avoiding the accompanying security risk.

BRIEF DESCRIPTION OF DRAWINGS

In order to clearly elucidate the technical solutions of the embodiments in the present disclosure, the accompanying drawings will be briefly described below. It should be understood that the drawings described below only illustrate several embodiments of the present disclosure. On basis of these drawings, those skilled in the art are able to obtain other possible drawings without paying any inventive efforts.

FIG. 4 is an equivalent schematic diagram of the circuit shown in FIG. 3;

FIG. 5 is a schematic flowchart of an implementation of Step S203 in the method shown in FIG. 2;

DESCRIPTION OF EMBODIMENTS

Figure 1:
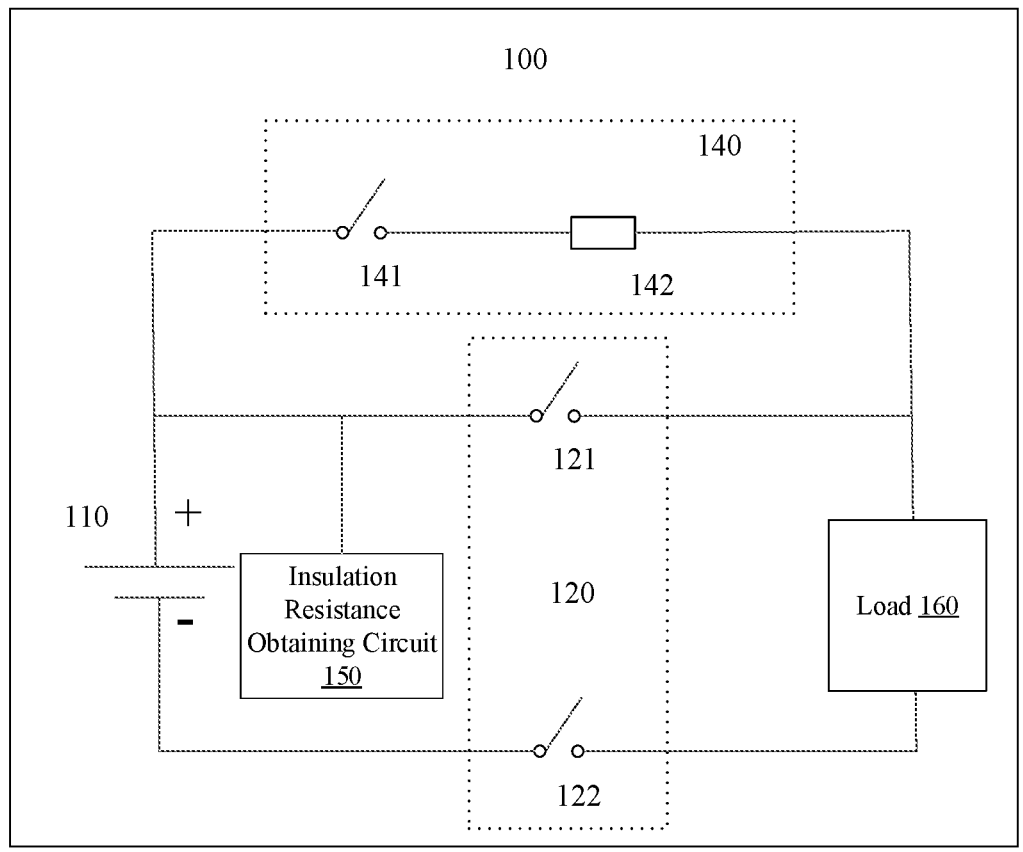
FIG. 1 is a schematic diagram of a circuit used in a method for obtaining an internal side insulation resistance and an external side insulation resistance of a relay according to an embodiment of the present disclosure.

In order to better understand the technical solutions of the present disclosure, the embodiments of the present disclosure are described in detail below with reference to the accompanying drawings.

It should be noted that the embodiments described below are only exemplary embodiments of the present disclosure, rather than all of the embodiments. Any other embodiment obtained by those skilled in the art on the basis of the described embodiments without creative efforts shall fall into the protection scope of the present disclosure.

Terms used in the embodiments of the present disclosure are merely for the purpose of describing particular embodiments, but not intended to limit the present disclosure. The singular forms "a," "an," and "the" used in the embodiments of the disclosure and the appended claims are also intended to include the plural forms thereof, unless the context clearly dictates otherwise.

It should be understood that the expression "and/or" used herein merely describes an associating relationship of the related objects, revealing three relationships, i.e., only A, both A and B, and only B. In addition, the character "/" in the context generally means an "or" relationship of the related objects.

It should be understood that the terms "first", "second", "third", etc. used to describe thresholds and the like in embodiments of the present disclosure are merely aimed to distinguish the thresholds from each other, but not intended to limit the thresholds. For example, without departing from the scope of embodiments of the present disclosure, the first alarm threshold may also be referred to as a second alarm threshold, and similarly, the second alarm threshold may also be referred to as a first alarm threshold.

Based on the context, the word "if" used herein may be interpreted as "when", "in response to a determination" or "in response to detection." Similarly, the phrase "if it is determined that . . . " or "if it is detected that (the stated condition or event)" may be interpreted as "when it is determined that . . . " or "in response to a determination" or "when (the stated condition or event) is detected" or "in response to the detection of (the stated condition or event)".

In order to solve the problem in the prior art that the external side insulation condition of a main relay cannot be obtained if the main relay is switched off, and to lower the accompanying safety risk, embodiments of the present disclosure provide the following solution: by using a method of inputting low-frequency AC signal, a low-frequency AC signal is input to the main positive relay from a side of the main positive relay close to the battery pack; then, an internal side insulation resistance of the main relay, i.e., the insulation resistance of the main relay at the side of the main positive relay close to the battery pack, is obtained when the main relay and a pre-charge relay are switched off; when it is determined that the internal side insulation resistance is normal, an external side insulation resistance value of the pre-charge relay, i.e., an insulation resistance of the pre-charge relay at a side of the pre-charge relay away from the battery pack, is obtained as an insulation resistance of the main relay by connecting the pre-charge relay.

Under this concept, the present disclosure provided the following feasible embodiments.

According to an embodiment of the present disclosure, a method for obtaining internal side and external side insulation resistance values of a relay can be applied to a circuit 100 shown in FIG. 1, the circuit 100 including a battery pack 110, a main relay 120 and a pre-charge circuit 140. The main relay 120 includes a main positive relay 121 and a main negative relay 122. The pre-charge circuit 140 includes a pre-charge relay 141 and a pre-charge resistor 142, and is parallel-connected to both sides of the main positive relay 121. An insulation resistance obtaining circuit is connected between the battery pack 110 and the main positive relay 121.

As shown in FIG. 1, a positive electrode (+) of the battery pack 110 is connected to the main positive relay 121, a negative pole (−) of the battery pack 110 is connected to the main negative relay 122, and a load 160 is connected between the main positive relay 121 and the main negative relay 122.

Figure 2:
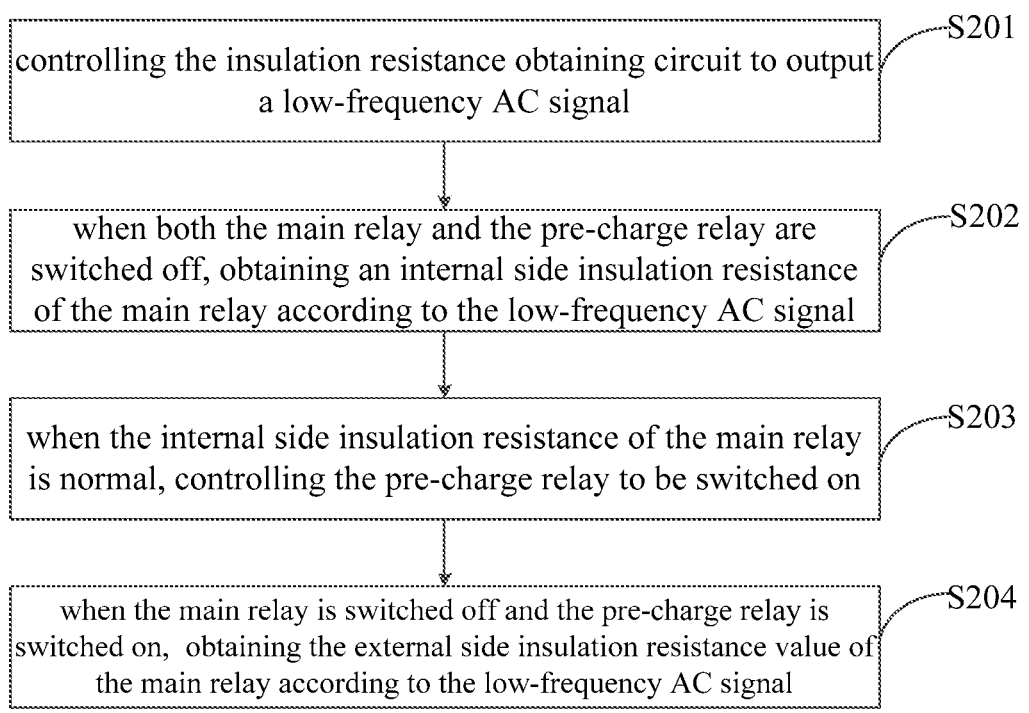
FIG. 2 is a schematic flowchart of a method for obtaining an internal side insulation resistance and an external side insulation resistance of a relay according to an embodiment of the present disclosure.

Specifically, as shown in FIG. 2, the method for obtaining the internal side and external side insulation resistances of the relay is applied to the circuit shown in FIG. 1, and can include the following steps:

S201, controlling the insulation resistance obtaining circuit to output a low-frequency AC signal.

S202, when both the main relay and the pre-charge relay are switched off, obtaining an internal side insulation resistance of the main relay according to the low-frequency AC signal.

When the main relay is switched off, it means that both the main positive relay and the main negative relay are switched off.

This method can be applied to a test before power-on. At this moment, the main positive relay, the main negative relay and the pre-charge relay are all in a switch-off state. Therefore, the S201 and S202 steps can be performed one after the other directly after power-on.

Alternatively, this method can be applied to a test after power-on. Considering that the relay may be in a switch-on state, it is also possible to control the main positive relay, the main negative relay and the pre-charge relay to be switched off firstly before step S202 is performed, and then to perform step S202.

S203, when the internal side insulation resistance of the main relay is normal, controlling the pre-charge relay to be switched on.

S204, when the main relay is switched off and the pre-charge relay is switched on, obtaining the external side insulation resistance value of the main relay according to the low-frequency AC signal.

The method shown in FIG. 2 may be implemented in a controller. When the controller is powered on, the above-mentioned method for obtaining the internal side and external side insulation resistances of the relay can be performed according to the method shown in FIG. 2. Alternatively, when the controller meets a preset startup condition, the method for obtaining the internal side and external side insulation resistances of the relay can also be performed according to the method shown in FIG. 2. The startup condition of this method is not specifically limited in the embodiments of the present disclosure.

In an embodiment, the controller can control the main positive relay, the main negative relay and the pre-charge relay to be switched off or switched on, and can also achieve the control of the insulation resistance obtaining circuit outputting the low-frequency AC signal and collecting an electrical signal.

In another embodiment, the controller may be a microcontroller unit (MCU) or a control component in a battery management system (BMS), or may be a control component in other devices or apparatuses, which is not specifically limited in the embodiments of the present disclosure.

In an embodiment, before performing S203, it is also necessary to determine whether the obtained internal side insulation resistance of the main relay is normal or not. In this case, the following steps are also included:

detecting whether the internal side insulation resistance of the main relay is normal or not;

if it is detected that the internal side insulation resistance of the main relay is normal, performing the step of controlling the pre-charge relay to be switched on and the subsequent steps;

if it is detected that the internal side insulation resistance of the main relay is abnormal, performing an alarm operation.

The alarm operation can be performed in manners including: at least one of outputting an alarm signal or outputting an alarm information. The alarm signal may include but not limited to an audio signal, a flicker signal, a vibration signal, and the like.

An embodiment of the present disclosure provides an feasible way to detect whether the internal side insulation resistance of the main relay is normal or not, including:

detecting whether the internal side insulation resistance of the main relay is greater than a first preset alarm threshold;

if the internal side insulation resistance of the main relay is greater than the first preset alarm threshold, determining that the internal side insulation resistance of the main relay is normal; and if the internal side insulation resistance of the main relay is less than or equal to the first preset alarm threshold, determining that the internal side insulation resistance of the main relay is abnormal.

In another embodiment, after step S204 is performed, it is also necessary to determine whether the obtained external side insulation resistance of the main relay is normal or not. In this case, the following steps are also included:

detecting whether the external side insulation resistance of the main relay is normal or not;

if it is detected that the external side insulation resistance of the main relay is normal, ending the detecting; and if it is detected that the external side insulation resistance of the main relay is abnormal, performing the alarm operation.

An embodiment of the present disclosure provides an feasible way to detect whether the external side insulation resistance of the main relay is normal, including:

detecting whether the external side insulation resistance of the main relay is greater than a second preset alarm threshold;

if the external side insulation resistance of the main relay is greater than the second preset alarm threshold, determining that the external side insulation resistance of the main relay is normal; and if the external side insulation resistance of the main relay is less than or equal to the second preset alarm threshold, determining that the external side insulation resistance of the main relay is abnormal.

In an embodiment, the first preset alarm threshold and the second present alarm threshold can be preset according to needs, and the first present alarm threshold and the second preset alarm threshold may be identical or not identical.

The step of ending the detection may include the following steps: controlling the main negative relay to be switched on, so that the load is pre-charged; when the pre-charge process ends, controlling the pre-charge relay to be switched off; and controlling the main positive relay to be switched on.

The principle of obtaining the insulation resistance according to the low-frequency AC signal in steps S202 and S204 are described below.

In the embodiments of the present disclosure, the insulation resistance obtaining circuit includes two sampling points. Therefore, the internal side and external side insulation resistances of the main relay can be obtained by collecting electrical signals at the two sampling points when the low-frequency AC signal passes through the two sampling points.

Figure 3:
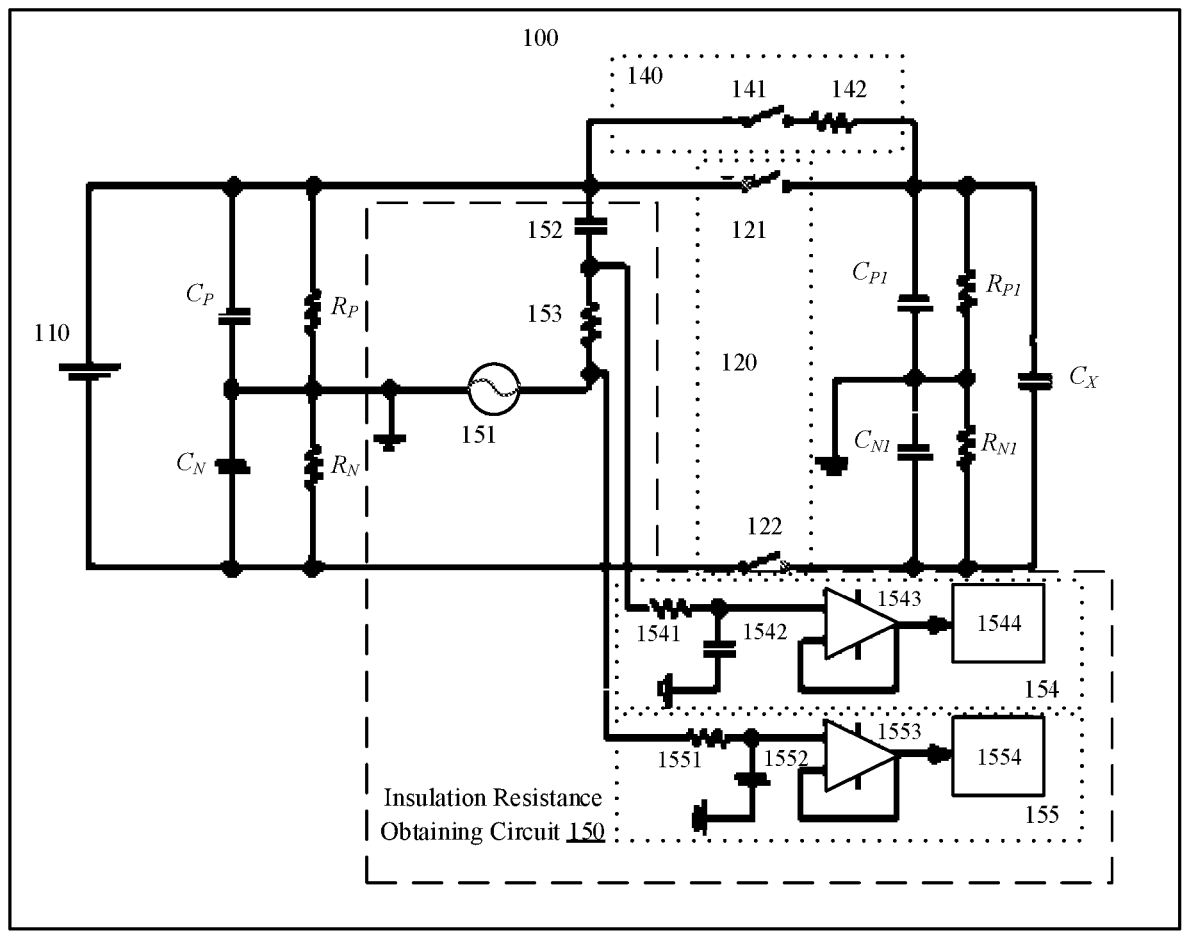
FIG. 3 is a schematically structural diagram of a circuit for obtaining insulation resistance values according to an embodiment of the present disclosure.

For ease of understanding, the present disclosure provides a specific embodiment of an insulation resistance obtaining circuit 150. Referring to FIG. 3, the insulation resistance obtaining circuit 150 includes: a signal synthesizer 151, wherein a first terminal of the signal synthesizer 151 is grounded; an isolation capacitor 152 connected between the positive electrode of the battery pack 110 and the main positive relay 121; a sampling resistor 153 connected between a second terminal of the isolation capacitor 152 and a second terminal of the signal synthesizer 151; a first sampling component 154 connected to a first terminal of the sampling resistor 153; and a second sampling component 155 connected to a second terminal of the sampling resistor 153.

The signal synthesizer 151 may be a direct digital synthesizer (DDS) for outputting a low-frequency signal. In a specific embodiment, the processor controls when the signal synthesizer 151 outputs a low-frequency signal.

In a specific embodiment, the structure of the first sampling component 154 is shown in FIG. 3. As shown in FIG. 3, the first sampling component 154 includes: a first filter resistor 1541, wherein a first terminal of the first filter resistor 1541 is connected to the first terminal of the sampling resistor 153; a first filter capacitor 1542, wherein a first terminal of the first filter capacitor 1542 is connected to a second terminal of the first filter resistor 1541, and a second terminal of the first filter capacitor 1542 is grounded; a first voltage follower 1543, wherein a first input terminal of the first voltage follower 1543 is connected to both the first terminal of the first filter capacitor 1542 and the second terminal of the first filter resistor 1541, and a second input terminal of the first voltage follower 1543 is connected to an output terminal of the first voltage follower 1543; and a first analog-to-digital converter 1544 connected to the output terminal of the first voltage follower 1543.

The first filter resistor 1541 and the first filter capacitor 1542 together form a filter circuit for filtering the collected electrical signals, so as to improve the sampling accuracy to a certain extent and further improve accuracy of an obtained insulation impedance of an AC motor.

During collecting of the electrical signal by the first sampling component 154, the first filter resistor 1541 and the first filter capacitor 1542 in the first sampling component 154 form a first-order RC filter circuit. Compared with a situation in which the first-order RC filter circuit is not incorporated, the first sampling component 154 as shown in FIG. 3 will cause phase shift and change in amplitude. When the first-order RC circuit is incorporated, equivalent to incorporating a resistor and a capacitor in the circuit, the thus obtained equivalent resistance becomes smaller and the equivalent capacitance becomes greater, so that phase shift becomes greater. Therefore, in order to reduce the influence of the first-order RC circuit on the accuracy of the insulation resistance value, a large first filter resistor 1541 and a small first filter capacitor 1542 can be selected when setting the first-order RC circuit, thereby improving the measurement accuracy of the insulation resistance value.

In another embodiment, the structure of the second sampling component 155 is shown in FIG. 3. As shown in FIG. 3, the second sampling component 155 includes: a second filter resistor 1551, wherein a first terminal of the second filter resistor 1551 is connected to the second terminal of the sampling resistor 153; a second filter capacitor 1552, wherein a first terminal of the second filter capacitor 1552 is connected to a second terminal of the second filter resistor 1551, and a second terminal of the second filter capacitor 1552 is grounded; a second voltage follower 1553, wherein a first input terminal of the second voltage follower 1553 is connected to both the first terminal of the second filter capacitor 1552 and the second terminal of the second filter resistor 1551, and a second input terminal of the second voltage follower 1553 is connected to an output terminal of the second voltage follower 1553; and a second analog-to-digital converter 1554 connected to the output terminal of the second voltage follower 1553.

To sum up, based on FIG. 3, when the low-frequency AC signal is a sinusoidal signal, the electrical signal U1 collected at the first sampling component 154 and the electrical signal U2 collected at the first sampling component 154 can be expressed as:

$$U1 = U*\sin(wt) + M$$

$$U2 = u*\sin(wt+\theta) + M$$

wherein U1 is an electrical signal collected by the first terminal of the sampling resistor 153, i.e., a sinusoidal signal generated by the signal synthesizer 151, U is an amplitude of the sinusoidal signal U1 generated by the signal synthesizer 151, w is an angular frequency of a sinusoid of the respective sinusoidal signal, and M is a bias voltage of the sinusoid; and U2 is an electrical signal collected by the second terminal of the sampling resistor 153, $\theta$ is a phase shift of U2 relative to U1, and u is an amplitude of U2.

Since U2 and U1 are sinusoidal signals with the same frequency, the angular frequencies of U2 and U1 are the same.

Based on this, during obtaining of the internal side and external side insulation resistances of the main relay, the phase shift and the amplitude of the low-frequency AC signal between the two sampling points can be determined according to the collected electric signal. Therefore, based on the Kirchhoff's law, the parallel resistance of impedances to ground in the current connection manner can be obtained as the insulation resistance of the relay.

Based on the insulation resistance obtaining circuit 150 as shown in FIG. 3, when the main positive relay 121 and the main negative relay 122 are switched off, there are two situations depending on the switch-on or switch-off status of the pre-charge relay 141:

A first situation: when the pre-charge relay is switched off, FIG. 4 can be referred to for an equivalent substitute circuit of the circuit 100.

As shown in FIG. 4, the signal synthesizer 151, the sampling resistor 153 and the isolation capacitor 152 are series-connected to one another, and are parallel-connected to an internal side parallel equivalent impedance $R_{np}$ and an internal side parallel equivalent capacitance $C_{np}$.

$R_{np}$ is a parallel resistance of an equivalent impedance $R_P$ of the positive electrode of the battery pack to the ground and an equivalent impedance $R_N$ of the negative electrode of the battery pack to the ground. $C_{np}$ is a parallel capacitance of an equivalent capacitance $C_P$ of the positive electrode of the battery pack to the ground and an equivalent capacitance $C_N$ of the negative electrode of the battery pack to the ground.

Due to the characteristics of the parallel connection, the internal side parallel equivalent impedance $R_{np}$ is smaller than the impedance $R_P$ of the positive electrode to the ground and is smaller than the equivalent impedance $R_N$ of the negative electrode of the battery pack to the ground. Therefore, the internal side parallel equivalent impedance $R_{np}$ can be obtained as the internal side insulation resistance of the main positive relay to determine the insulation situation at the side of the main positive relay close to the battery pack.

In this case, referring to FIG. 5, the step S203 may include following steps:

S2031: when both the main relay and the pre-charge relay are switched off, collecting electrical signals at the two sampling points by the insulation resistance obtaining circuit.

S2032: obtaining a first phase shift of the low-frequency AC signal between the two sampling points according to the collected electrical signals.

S2033: obtaining the internal side insulation resistance of the main relay according to the collected electrical signals and the first phase shift.

Specifically, the internal side insulation resistance $R_{np}$ of the main relay, i.e., insulation resistance of the main relay at a side of the main relay close to the battery pack, can be expressed as the following formula:

$$R_{np} = \frac{(U*\cos(\theta)-u)*u*R1}{U^2 - 2*U*u*\cos(\theta)+u^2} * \left[\frac{\left(\begin{array}{c} w*C1*U*u*R1*\sin(\theta) + \\ U^2 + u^2 - 2*U* \\ u*\cos(\theta) \end{array}\right)^2}{w^2*C1^2*u^2*R1^2*(U*\cos(\theta)-u)^2} + 1\right],$$

wherein $R_{np}$ is the internal side insulation resistance of the main relay, U1 is an electrical signal collected by the first terminal of the sampling resistor 153, i.e., the sinusoidal signal generated by the signal synthesizer 151, U is the amplitude of the sinusoidal signal U1 generated by the signal synthesizer 151, w is an angular frequency of a sinusoid of the sinusoidal signal U1, and M is a bias voltage of the sinusoid, U2 is an electrical signal collected by the second terminal of the sampling resistor 153, θ is a phase shift of U2 relative to U1, and u is an amplitude of U2.

It should be noted that, the U1 and U2 in the present case are collected when the main positive relay, the main negative relay and the pre-charge relay are all switched off.

Figure 6:
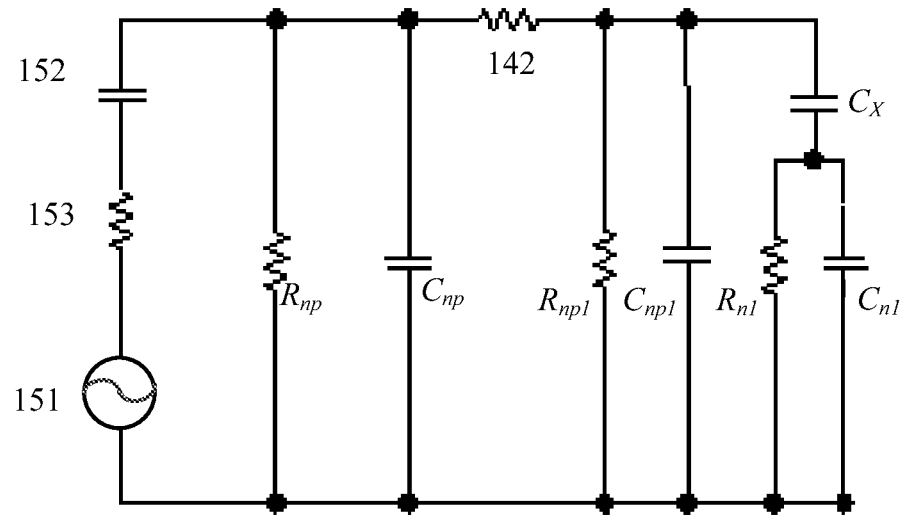
FIG. 6 is another equivalent schematic diagram of the circuit shown in FIG. 3.

A second situation: when the pre-charge relay is switched on, FIG. 6 can be referred to for an equivalent substitute circuit of the circuit 100.

As shown in FIG. 6, the signal synthesizer 151, the sampling resistor 153 and the isolation capacitor 152 are connected in series, and the series-connected signal synthesizer 151, sampling resistor 153 and isolation capacitor 152, the internal side parallel equivalent impedance $R_{np}$, and the internal side parallel equivalent capacitance $C_{np}$ are connected in parallel to the first terminal of the pre-charge resistor 142. An external side parallel equivalent impedance $R_{np1}$, an external side parallel equivalent capacitance $C_{np1}$, and a load equivalent capacitance $C_X$ are connected in parallel to a second terminal of the pre-charge resistor 142. A relay external side positive equivalent resistance $R_{n1}$ and a relay internal side positive equivalent capacitance $C_{n1}$ are connected in parallel to the other terminal of the load equivalent capacitance $C_X$.

Figure 7:
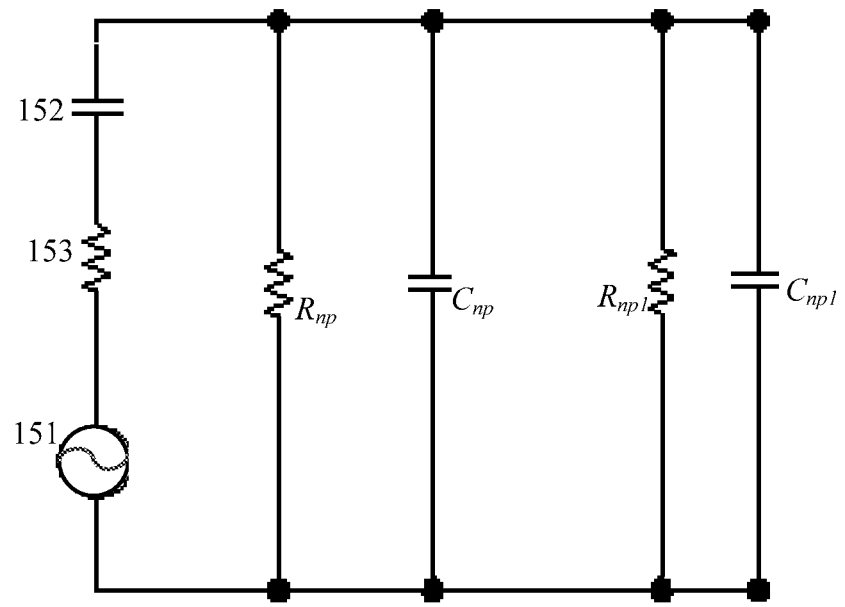
FIG. 7 is an equivalent schematic diagram of the circuit shown in FIG. 6.

Since the load equivalent capacitance $C_X$ is quite great with respect to the relay external side positive equivalent resistance $R_{n1}$ and the relay external side positive equivalent capacitance $C_{n1}$, FIG. 6 can also be equivalently substituted by FIG. 7.

As shown in FIG. 7, the signal synthesizer 151, the sampling resistor 153, and the isolation capacitor 152 are connected in series, and the series-connected signal synthesizer 151, sampling resistor 153 and isolation capacitor 152, the internal side parallel equivalent impedance $R_{np}$, the internal side parallel equivalent capacitance $C_{np}$, the external side parallel equivalent impedance $R_{np1}$, and the external side parallel equivalent capacitance $C_{np1}$ are connected in parallel.

In this case, the circuit 100 shown in FIG. 7 and the circuit 100 shown in FIG. 4 are constituted based on the parallel connection of the internal side parallel equivalent impedance $R_{np}$, the internal side parallel equivalent capacitance $C_{np}$, the external side parallel equivalent impedance $R_{np1}$, and the external side parallel equivalent capacitance $C_{np1}$, so that the step S205 can be performed in a manner similar to that of S203 shown in FIG. 5.

Figure 8:
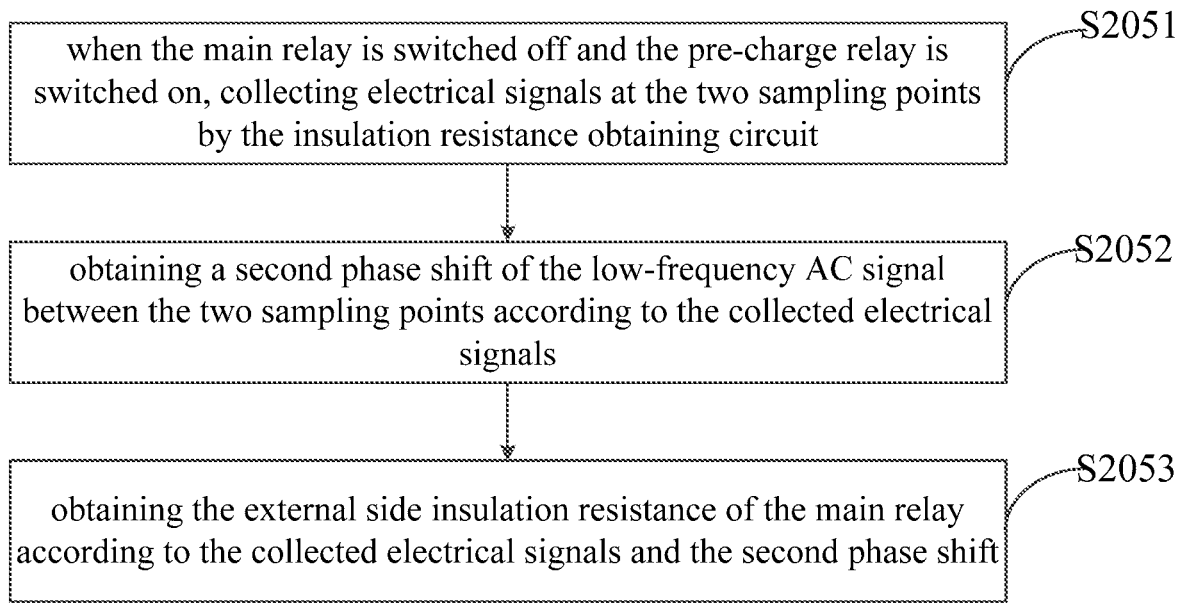
FIG. 8 is a schematic flowchart of an implementation of Step S205 in the method shown in FIG. 2.

In this case, referring to FIG. 8, the step S205 can perform in the following manner:

S2051: when the main relay is switched off and the pre-charge relay is switched on, collecting electrical signals at the two sampling points by the insulation resistance obtaining circuit;

S2052: obtaining a second phase shift of the low-frequency AC signal between the two sampling points according to the collected electrical signals;

S2053: obtaining the external side insulation resistance of the main relay according to the collected electrical signals and the second phase shift.

When the low-frequency AC signal is still in a sinusoid form, the external side insulation resistance $R_{np}$ of the main relay can be expressed as follows:

$$R_{np1} = \frac{(U*\cos(\theta)-u)*u*R1}{U^2-2*U*u*\cos(\theta)+u^2} * \left[\frac{\left(w*C1*U*u*R1*\sin(\theta)+\atop U^2+u^2-2*U*u*\cos(\theta)\right)^2}{w^2*C1^2*u^2*R1^2*(U*\cos(\theta)-u)^2}+1\right],$$

wherein $R_{np1}$ is the external side insulation resistance of the main relay, U1 is an electrical signal collected by the first terminal of the sampling resistor 153, i.e., a sinusoidal signal generated by the signal synthesizer 151, U is an amplitude of the sinusoidal signal U1 generated by the signal synthesizer 151, w is an angular frequency of a sinusoid of the sinusoidal signal U1, and M is the bias voltage of the sinusoid; and U2 is an electrical signal collected by the second terminal of the sampling resistor 153, θ is a phase shift of U2 relative to U1, and u is an amplitude of U2.

It should be noted that, the U1 and U2 in the present case are collected when the main positive relay and the main negative relay are switched off and the pre-charge relay is switched on.

The technical solutions in the above embodiments of the present disclosure have the following beneficial effects:

In the embodiments of the present disclosure, with respect to the circuit formed by the battery pack, the main relay and the pre-charge circuit, a low-frequency AC signal can be output by the insulation resistance obtaining circuit connected between the battery pack and the main positive relay, so as to obtain the internal side insulation resistance of the main relay when the main relay and the pre-charging relay are switched off; and when the internal side insulation resistance of the main relay is determined to be normal, the pre-charge relay is controlled to be switched on, and then the low-frequency AC signal is input into the pre-charge circuit, so as to obtain the external side insulation resistance of the pre-charge relay (equivalent to obtaining of the external side insulation resistance of the main relay) based on the low-frequency AC signal. In this process, the switched-off main relay excludes the security risk caused by the switch-on of the main relay when an insulation fault occurs to the side of the main relay away from the battery pack. Therefore, the technical solution provided by the embodiment of the present disclosure can obtain the external side and internal side insulation conditions of the main relay, so as to solve the problem in the prior art that the insulation condition at the side of the main relay away from the battery pack cannot be obtained when the main relay is switched off while avoiding the accompanying security risk.

Based on the methods for obtaining the internal side and external side resistances of the relay provided in the above embodiments, an embodiment of the present disclosure further provides a device for performing the steps and the methods mentioned in the above embodiment.

Figure 9:
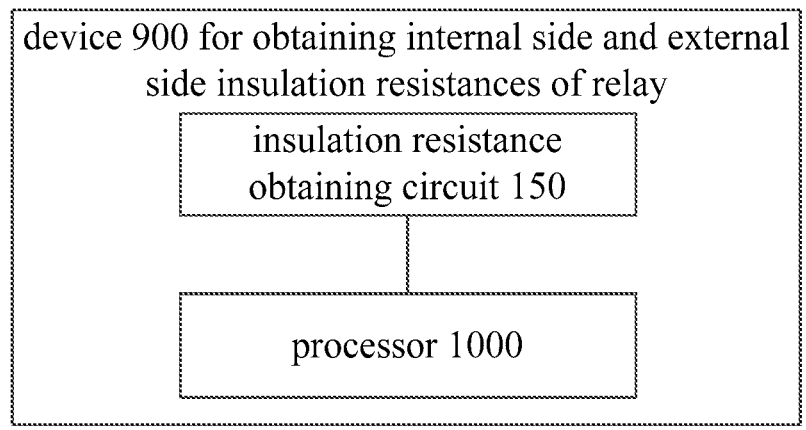
FIG. 9 is a schematically structural diagram of a device for obtaining an internal side insulation resistance and an external side insulation resistance of a relay according to an embodiment of the present disclosure.

Firstly, the embodiment of the present disclosure provides a device for obtaining internal side and external side insulation resistances of a relay. Referring to FIG. 9, the device 900 for obtaining the internal side and external side insulation resistances of the relay includes an insulation resistance obtaining circuit 150 for outputting an AC signal and collecting an electrical signal; and a processor 1000, wherein the processor 1000 is configured to: control the insulation resistance obtaining circuit to output a low-frequency AC signal; obtain the internal side insulation resistance of the main relay according to the low-frequency AC signal, when both the main relay and the pre-charge relay are switched off; control the pre-charge relay to be switched on when the internal side insulation resistance of the main relay is normal; and obtain the external side insulation resistance of the main relay according to the low-frequency AC signal when the main relay is switched off and the pre-charge relay is switched on.

Figure 10:
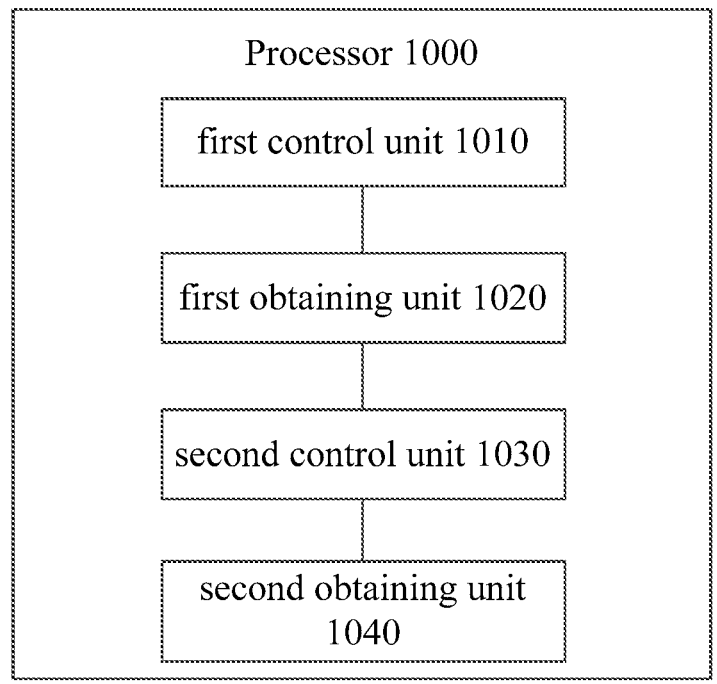
FIG. 10 is a schematically structural diagram of a processor according to an embodiment of the present disclosure.

In addition, an embodiment of the present disclosure further provides a processor. Referring to FIG. 10, the processor 1000 includes: a first control unit 1010 for controlling the insulation resistance obtaining circuit to output a low-frequency AC signal; a first obtaining unit 1020 for obtaining the internal side insulation resistance of the main relay according to the low-frequency AC signal, when both the main relay and the pre-charge relay are switched off; a second control unit 1030 for controlling the pre-charge relay to be switched on when the internal side insulation resistance of the main relay is normal; and a second obtaining unit 1040 for obtaining the external side insulation resistance of the main relay according to the low-frequency AC signal, when the main relay is switched off and the pre-charge relay is switched on.

Figure 11:
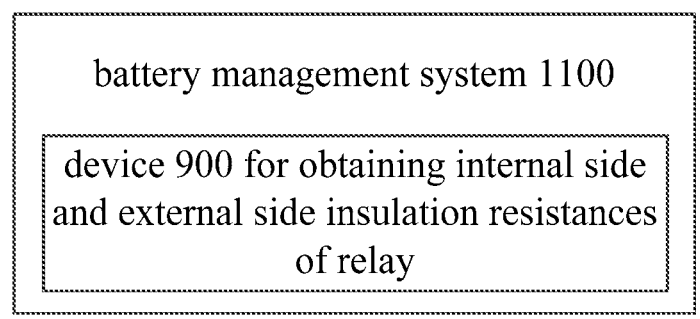
FIG. 11 is a schematically structural diagram of a battery management device according to an embodiment of the present disclosure.

In addition, an embodiment of the present disclosure also provides a battery management system. Referring to FIG. 11, the battery management system 1100 includes the device 900 for obtaining the internal side and external side insulation resistances of the relay.

At last, an embodiment of the present disclosure provides a computer-readable storage medium, including: computer-executable instructions. The computer-executable instructions are executed to implement the method for obtaining the internals side and external side insulation resistances of the relay according to any one of the above-described embodiments.

Since the units in the embodiment can perform the methods described in the above embodiments, the related description in the above method embodiments can be referred for the part that is not described in detail herein.

The technical solutions in the device embodiments of the present disclosure have the following beneficial effects:

In the embodiments of the present disclosure, with respect to the circuit formed by the battery pack, the main relay and the pre-charge circuit, a low-frequency AC signal can be output by the insulation resistance obtaining circuit connected between the battery pack and the main positive relay, so as to obtain the internal side insulation resistance of the main relay when the main relay and the pre-charging relay are switched off; and when the internal side insulation resistance of the main relay is determined to be normal, the pre-charge relay is controlled to be switched on, and then the low-frequency AC signal is input into the pre-charge circuit, so as to obtain the external side insulation resistance of the pre-charge relay (i.e. equivalent to obtaining of the external side insulation resistance of the main relay) based on the low-frequency AC signal. In this process, the switched-off main relay excludes the security risk caused by the switch-on of the main relay when an insulation fault occurs to the side of the main relay away from the battery pack. Therefore, the technical solution provided by the embodiments of the present disclosure can obtain the internal side and external side insulation conditions of the main relay, so as to solve the problem in the prior art that the insulation condition at the side of the main relay away from the battery pack cannot be obtained when the main relay is switched off while avoiding the accompanying security risk.

Those skilled in the art can clearly understand that, for the convenience and simplicity of description, the specific working process of the above-mentioned system, device, and units can be known by referring to the corresponding steps in the described embodiments of the methods, which are not described in detail herein.

It should be understood that, the system, device, and method disclosed in the embodiments provided by the present disclosure may be embodied in other manners. For example, the embodiments of the device described above are merely exemplary. For example, the units are merely divided according to logical function and may be divided in other manners in practical implementations. For example, multiple units or components may be combined or integrated into another system, or some of the features can be omitted or not embodied. In addition, mutual coupling, direct coupling or communication connection shown or discussed above may be indirect coupling or communication connection through interfaces, devices or units, and may be electrical, mechanical or in other forms.

The units described as separate components may be or may not be physically separated. The components described as units may be or may not be physical units, that is, may be located in one place or may also be distributed to multiple network units. Some or all of the units may be selected according to actual needs to achieve the objects of the solution in the embodiment.

In addition, the functional units in the embodiments of the present disclosure may be integrated in one processing unit, or may be separately and physically present, or two or more units may be integrated in one unit. The above-mentioned integrated unit can be embodied in a form of hardware or in a form of hardware-software functional unit.

The integrated units embodied in the form of software function unit may be stored in a computer-readable storage medium. The software function unit is stored in a storage medium and includes several instructions for causing a computer device (for example, a personal computer, a server, a network device, or the like) or a processor to execute some steps of the method according to each embodiment of the present disclosure. The above-mentioned storage medium includes various media capable of storing program code, such as USB flash disk, mobile hard disk, Read-Only Memory (ROM), Random Access Memory (RAM), magnetic disk, compact disc, and the like.

The foregoing merely describes preferable embodiments of the present disclosure, but is not intended to limit the present disclosure. Any modification, equivalent substitution, improvement, and the like made within the principles of the present disclosure should be included in the protection scope of the present disclosure.

What is claimed is:

1. A method for obtaining internal side and external side insulation resistances of a relay, wherein the method is applied to a circuit comprising a battery pack, a main relay and a pre-charge circuit, the main relay comprises a main positive relay and a main negative relay, the pre-charge circuit comprises a pre-charge relay and a pre-charge resistor, and wherein the pre-charge circuit is connected in parallel to both sides of the main positive relay, an insulation resistance obtaining circuit is connected between the battery pack and the main positive relay, wherein the method comprises steps of:

controlling the insulation resistance obtaining circuit to output a low-frequency AC signal;

when both the main relay and the pre-charge relay are switched off, obtaining an internal side insulation resistance of the main relay according to the low-frequency AC signal;

when the internal side insulation resistance of the main relay is normal, controlling the pre-charge relay to be switched on; and when the main relay is switched off and the pre-charge relay is switched on, obtaining an external side insulation resistance of the main relay according to the low-frequency AC signal, wherein before the step of controlling the pre-charge relay to be switched on, the method further comprises steps of:

detecting whether the internal side insulation resistance of the main relay is normal or not;

when it is detected that the internal side insulation resistance of the main relay is normal, performing the step of controlling the pre-charge relay to be switched on and the subsequent steps; and when it is detected that the internal side insulation resistance of the main relay is abnormal, performing an alarm operation.

2. The method according to claim 1, wherein the step of detecting whether the internal side insulation resistance of the main relay is normal or not comprises:

detecting whether the internal side insulation resistance of the main relay is greater than a first preset alarm threshold;

when the internal side insulation resistance of the main relay is greater than the first preset alarm threshold, determining that the internal side insulation resistance of the main relay is normal; and when the internal side insulation resistance of the main relay is smaller than or equal to the first preset alarm threshold, determining that the internal side insulation resistance of the main relay is abnormal.

3. The method according to claim 1, further comprising steps of:

detecting whether the external side insulation resistance of the main relay is normal or not;

when it is detected that the external side insulation resistance of the main relay is normal, ending the detecting; and when it is detected that the external side insulation resistance of the main relay is abnormal, performing an alarm operation.

4. The method according to claim 3, wherein the step of detecting whether the external side insulation resistance of the main relay is normal or not comprises:

detecting whether the external side insulation resistance of the main relay is greater than a second preset alarm threshold;

when the external side insulation resistance of the main relay is greater than the second preset alarm threshold, determining that the external side insulation resistance of the main relay is normal; and when the external side insulation resistance of the main relay is smaller than or equal to the second preset alarm threshold, determining that the external side insulation resistance of the main relay is abnormal.

5. The method according to claim 3, wherein the step of ending the detecting comprises steps of:

controlling the main negative relay to be switched on, so as to pre-charge a load;

when the pre-charging of the load ends, controlling the pre-charge relay to be switched off; and controlling the main positive relay to be switched on.

6. The method according to claim 1, wherein the insulation resistance obtaining circuit comprises two sampling points.

7. The method according to claim 6, wherein the step of obtaining the internal side insulation resistance of the main relay according to the low-frequency AC signal comprises:

when both the main relay and the pre-charge relay are switched off, collecting electrical signals at the two sampling points by the insulation resistance obtaining circuit;

obtaining a first phase shift of the low-frequency AC signal between the two sampling points according to the collected electrical signals and obtaining a change in amplitude of the electrical signals collected at the two sampling points; and obtaining the internal side insulation resistance of the main relay according to the collected electrical signals and the first phase shift.

8. The method according to claim 6, wherein the step of obtaining the external side insulation resistance of the main relay according to the low-frequency AC signal comprises:

when the main relay is switched off and the pre-charge relay is switched on, collecting electrical signals at the two sampling points by the insulation resistance obtaining circuit;

obtaining a second phase shift of the low-frequency AC signal between the two sampling points according to the collected electrical signals; and obtaining the external side insulation resistance of the main relay according to the collected electrical signals and the second phase shift.

9. The method according to claim 6, wherein the insulation resistance obtaining circuit comprises:

a signal synthesizer having a first terminal grounded;

an isolation capacitor connected between a positive electrode of the battery pack and the main positive relay;

a sampling resistor connected between a second terminal of the isolation capacitor and a second terminal of the signal synthesizer;

a first sampling component connected to a first terminal of the sampling resistor; and a second sampling component connected to a second terminal of the sampling resistor.

10. The method according to claim 1, wherein the insulation resistance obtaining circuit comprises:

a signal synthesizer having a first terminal grounded;

an isolation capacitor connected between a positive electrode of the battery pack and the main positive relay;

a sampling resistor connected between a second terminal of the isolation capacitor and a second terminal of the signal synthesizer;

a first sampling component connected to a first terminal of the sampling resistor; and a second sampling component connected to a second terminal of the sampling resistor.

11. The method according to claim 10, wherein the first sampling component comprises:

a first filter resistor having a first terminal connected to the first terminal of the sampling resistor;

a first filter capacitor having a first terminal connected to a second terminal of the first filter resistor and a second terminal grounded;

a first voltage follower having a first input terminal connected to both the first terminal of the first filter capacitor and the second terminal of the first filter resistor, and a second input terminal connected to an output terminal of the first voltage follower; and a first analog-to-digital converter connected to the output terminal of the first voltage follower.

12. The method according to claim 10, wherein the second sampling component comprises:

a second filter resistor having a first terminal connected to the second terminal of the sampling resistor;

a second filter capacitor having a first terminal connected to a second terminal of the second filter resistor, and a second terminal grounded;

a second voltage follower having a first input terminal connected to both the first terminal of the second filter capacitor and the second terminal of the second filter resistor, and a second input terminal connected to an output terminal of the second voltage follower; and a second analog-to-digital converter connected to the output terminal of the second voltage follower.

13. A device for obtaining internal side and external side insulation resistances of a relay, comprising an insulation resistance obtaining circuit for outputting an AC signal and collecting an electrical signal, and a processor, wherein the processor is configured to:

control the insulation resistance obtaining circuit to output a low-frequency AC signal;

obtain an internal side insulation resistance of a main relay according to the low-frequency AC signal when both the main relay and a pre-charge relay are switched off;

control the pre-charge relay to be switched on when the internal side insulation resistance of the main relay is normal; and obtain an external side insulation resistance of the main relay according to the low-frequency AC signal when the main relay is switched off and the pre-charge relay is switched on, wherein before the step of controlling the pre-charge relay to be switched on, the processor is further configured to:

detect whether the internal side insulation resistance of the main relay is normal or not;

control the pre-charge relay to be switched on and then obtain the external side insulation resistance of the main relay according to the low-frequency AC signal when it is detected that the internal side insulation resistance of the main relay is normal; and perform an alarm operation when it is detected that the internal side insulation resistance of the main relay is abnormal.

14. A battery management system comprising the device for obtaining the internal side and external side insulation resistances of a relay according to claim 13.

* * * * *